United States Patent [19]
Wilson

[11] Patent Number: 5,278,462
[45] Date of Patent: Jan. 11, 1994

[54] THRESHOLD CROSSOVER DETECTOR WITH IMPROVED DIGITAL NOISE REJECTION

[75] Inventor: Michael A. Wilson, Deland, Fla.

[73] Assignee: Fasco Controls Corporation, Shelby, N.C.

[21] Appl. No.: 873,253

[22] Filed: Apr. 24, 1992

[51] Int. Cl.[5] .............................................. H03K 5/153
[52] U.S. Cl. .................................. 307/354; 307/542; 307/491; 328/150
[58] Field of Search ............... 307/354, 309, 542.1, 307/491, 542; 324/78; 328/150, 117

[56] References Cited

U.S. PATENT DOCUMENTS

| | | | |
|---|---|---|---|
| 3,955,102 | 5/1976 | Chi | 307/354 |
| 4,090,144 | 5/1978 | Jenik et al. | 328/150 |
| 4,575,683 | 3/1986 | Roberts et al. | 307/354 |
| 4,609,869 | 9/1986 | Metcalf | 307/354 |
| 4,652,833 | 3/1987 | Batts | 307/354 |
| 4,924,483 | 5/1990 | Cho | 307/354 |
| 5,019,722 | 5/1991 | Hess et al. | 307/354 |

Primary Examiner—John Zazworsky
Attorney, Agent, or Firm—Shlesinger, Fitzsimmons & Shlesinger

[57] ABSTRACT

The detector applies an analog input signal through respectively positive and negative offset voltages to the inputs of two comparators, one of which produces a first output signal as the input signal passes beyond a predetermined minimum voltage in the positive going direction, and the other of which produces a second output signal when the input voltage exceeds a minimum predetermined value in a negative going direction. The input signal is also applied directly to the input of a third comparator the output of which produces a third signal each time the input signal crosses over zero voltage in a positive going direction. The first and second comparator output signals are applied to the reset and set terminals, respectively, of a first flip flop. The output of this first flip flop, and the output of the third comparator are applied through an AND gate to the set terminal of a second flip flop. The second flip flop produces at its output a digital signal precisely at the time that a signal is produced at the output of the third comparator, provided the outputs of the first and second comparators have been successively generated in the cycle of the input voltage immediately preceding the output signal of the third comparator.

13 Claims, 2 Drawing Sheets

THRESHOLD CROSSOVER DETECTOR WITH IMPROVED DIGITAL NOISE REJECTION

BACKGROUND OF THE INVENTION

This invention relates to analog signal sensing circuits, and more particularly to analog sensor circuitry used in automotive ignition systems and the like. Even more particularly, this invention relates to an improved method for accurately detecting the threshold crossover events of an analog signal, and an improved crossover detector therefor having digital noise rejection accomplished without the use of hysteresis.

Threshold crossover detection of an analog signal is necessary for numerous applications. For example, crossover detectors are used in conjunction with a Hall sensor for the regulation of spark plug firing in conventional ignition systems. In these applications noise introduced through cross-talk with other circuits may interfere with the analog output of the Hall sensor, and may thus produce false threshold or zero crossover events. Such false events may initiate an untimed, erroneous spark plug response, thereby creating poor engine operation. To insure the accuracy of the detector, it is therefore desirable to remove the noise from the analog signal prior to the transmission of the signal to the spark plugs.

Many sensors operate at low analog input signal levels, and ideally at crossover produce a digital output signal. For sensors such as these, there is generally a trade-off between output signal accuracy (timing) and the ability to reject noise by means of hysteresis. Heretofore, efforts have been made to achieve noise rejection without sacrificing the accuracy of the output signal by selectively altering the effective hysteresis of a switching circuit during different portions of the analog input signal, as disclosed for example in my U.S. Pat. No. 3,916,328. This prior art, however, has revealed certain shortcomings of the analog method, such as the requirement of additional components for maintenance of hysteresis while switching analog levels.

Both U.S. Pat. Nos. 3,818,358 and 4,795,915 disclose what are termed as zero crossover digital noise rejection filters, but neither filter produces an output signal exactly at zero crossover of the input signal. More pertinent is U.S. Pat. No. 5,019,722, which discloses a threshold-crossing detection device with improved noise rejection that utilizes an integrated form of the sensor output to produce a binary signal having high and low levels. This binary signal is further processed for removal of multiple unwanted transitions resulting from noise. This prior art, however, has generally failed to produce a zero crossover detection device which is completely accurate and therefore free of output signal timing delays. Such timing delays are caused by the use of hysteresis or possibly other means for noise reduction.

It is therefore an object of this invention to provide an improved method of detecting a threshold crossover of the type described, and a novel detector whose digital output signal is accurately timed and substantially completely free of noise error.

Another object of this invention is to provide a threshold crossover detector which utilizes digital logic rather than hysteresis for rejection of noise present in an analog input signal, thus freeing the output signal from undesirable timing delays.

Other objects of this invention will become apparent hereinafter from the recital of the specification and appended claims, particularly when read in conjunction with the accompanying drawings.

SUMMARY OF THE INVENTION

The present invention utilizes three comparators aligned in parallel for reception of the noise laden analog input signal. The inputs of two of the comparators are offset or supplemented with voltages slightly less than the minimum analog signal that is to be sensed. For example, one of the comparators receives the analog signal after it has been offset by +15 millivolts for the purpose of relaying a first binary signal when the analog signal crosses a minimal threshold level near its negative (low) peak. Similarly, a second comparator receives the analog signal after it has been offset by −15 millivolts for the purpose of relaying a second binary signal when the analog signal crosses a maximal threshold level near its positive (high) peak. However, the third comparator receives an unaltered analog input signal for the purpose of relaying a third binary signal coincident with the timing of the zero crossover event of the input signal. The first and second binary signals from the offset comparators are used to trigger the set and reset ports, respectively, of a first flip-flop in order to limit the firing time of a second flip-flop which receives the third binary signal at its set terminal. Two AND gates serially located before the set and reset terminals of the second flip-flop insure that a binary output signal will be emitted from the set terminal of the second flip-flop only upon the first zero crossover of the input signal in the positive direction following an indication by the offset comparators that the input signal had in fact just passed through noise free or true high (was high) and true low (was low) values.

DETAILED DESCRIPTION OF THE PREFERRED EMBODIMENT

Figure 1:
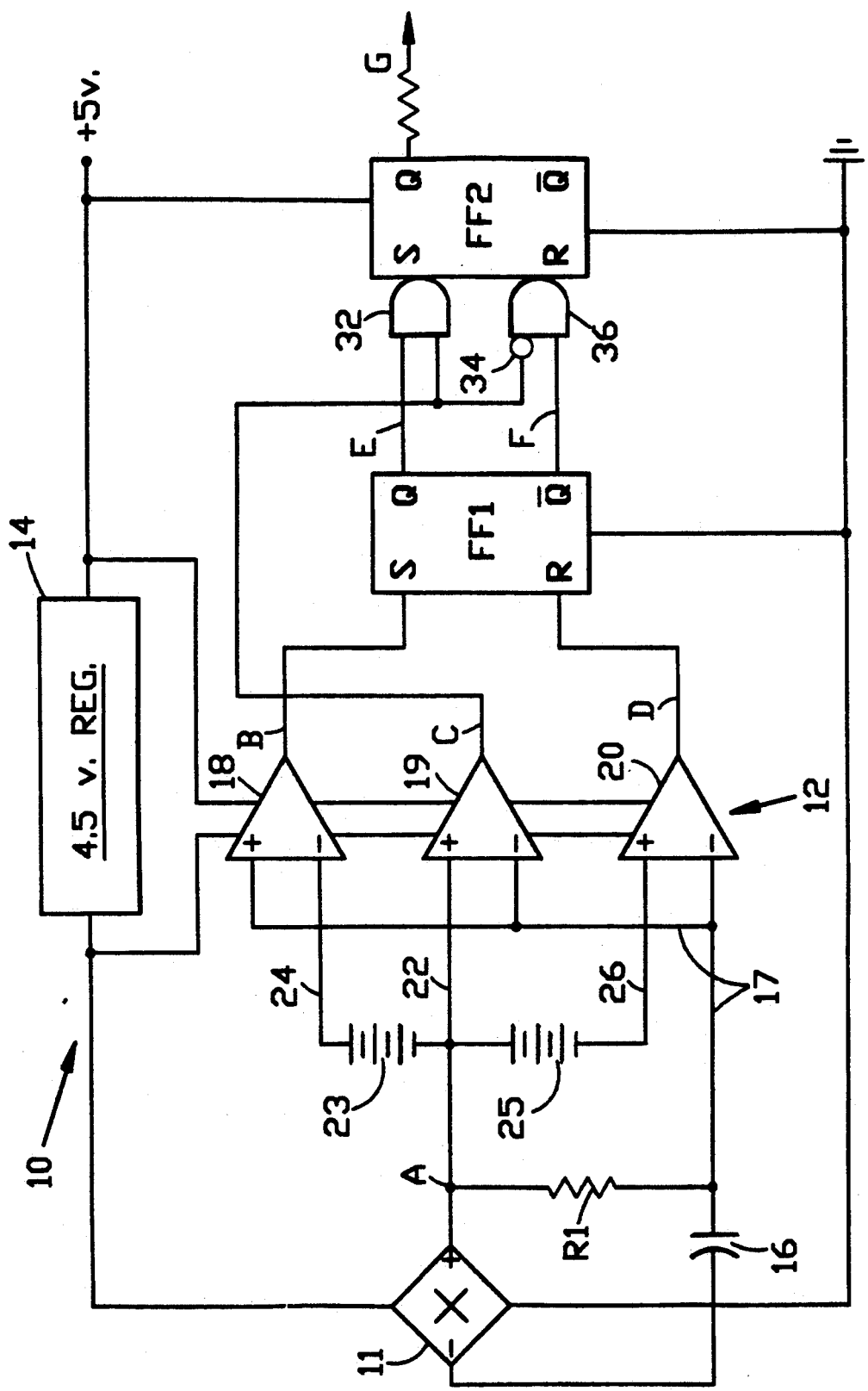
FIG. 1 is a circuit diagram illustrating a Hall sensor for a conventional ignition system connected to a threshold crossover detector made according to one embodiment of this invention.

Referring first to FIG. 1, 10 generally denotes part of an automotive ignition circuit containing a sensor 11 (such as a conventional Hall sensor, for example), and a novel threshold crossover detector denoted generally by the numeral 12. In the embodiment illustrated sensor 11 is energized by the output of a 4.5 volt precision regulator 14, and produces at point A an analog output signal which is filtered by an R/C circuit comprising a resistor R1 and capacitor 16. The juncture between R1 and capacitor 16 is connected by line 17 to one input of each of three differential amplifiers or comparators 18, 19 and 20, each of which also is powered by the regulator 14. Each of the comparators 18, 19 and 20 is of conventional design, and has an inverting input denoted by a minus sign, and a non-inverting input denoted by a plus sign. In the illustrated embodiment, the signal on line 17 is applied to the non-inverting inputs of comparators 19 and 20, and to the signal inverting input of comparator 18.

Figure 2:
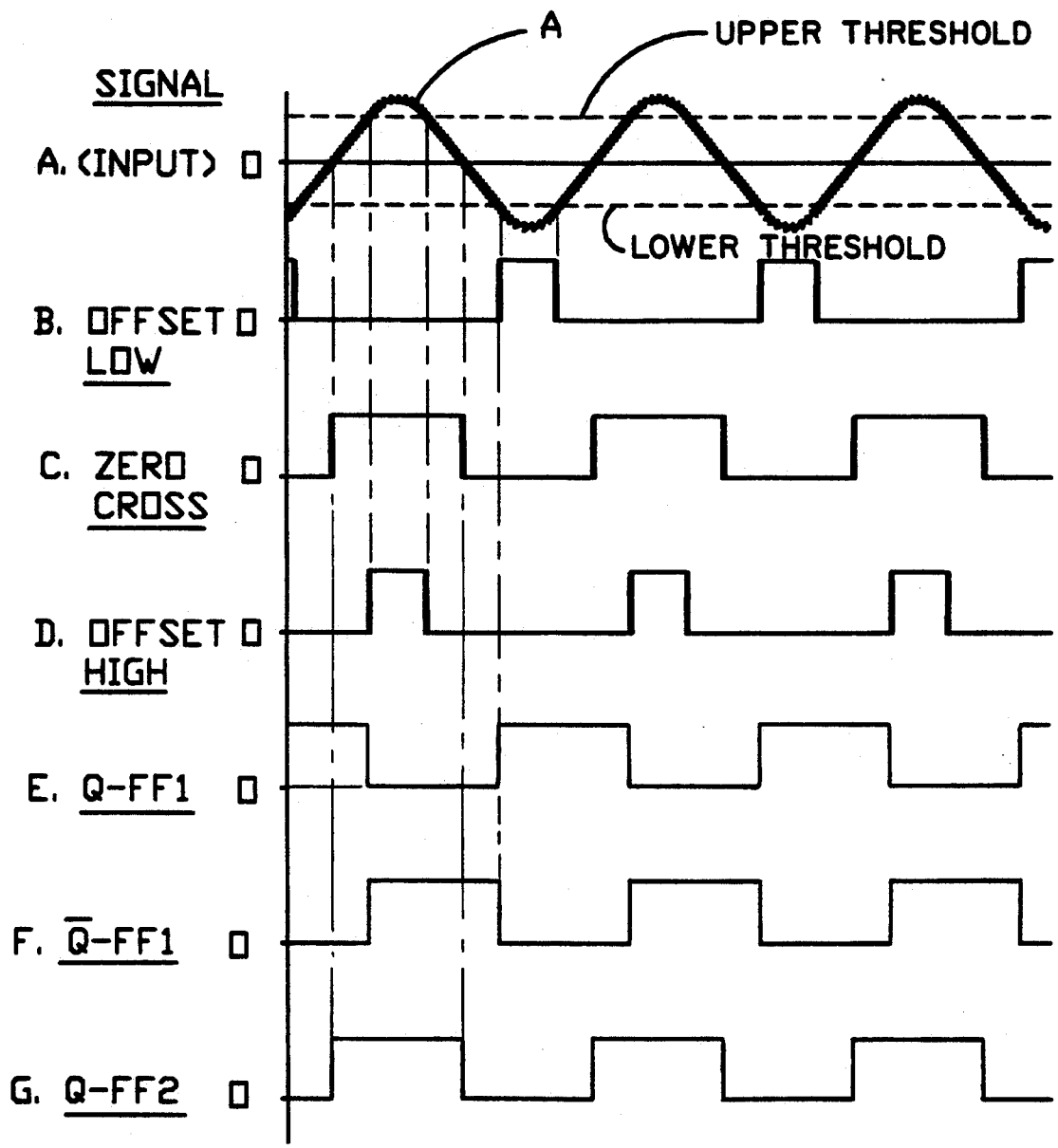
FIG. 2 is a voltage vs. time diagram for a threshold crossover detector of the type shown in FIG. 1.

The analog signal A, which is also denoted in FIG. 2 by the wave form A, is also connected by line 22 directly to the non-inverting input of comparator 19. Signal A is also connected to the inverting and non-inverting inputs, respectively, of comparators 18 and 20, but through two different voltage offset devices. For example, in the illustrated embodiment line 22 is connected to the negative terminal of a 15 millivolt battery 23, the positive terminal of which is connected by line 24 to the inverting input of comparator 18. Line 22 is also connected to the positive terminal of another 15 millivolt battery 25, the negative terminal of which is connected by a line 26 to the non-inverting input of comparator 20. As a consequence, signal A is subjected to a −15 mv. gradient when applied to the non-inverting input of comparator 20, and to a +15 mv. gradient when applied to line 26 to the inverting terminal of the comparator 18.

By introducing such voltage gradients, which in practice are selected to be slightly less than the anticipated lowest output signal that will be produced by sensor 11, the voltage signal necessary to trigger a change in the output of a respective one of comparators 18 and 20 (i.e., its threshold level) can be further separated from the zero crossover event of the incoming signal A, thus reducing the likelihood of a noise spike creating a false threshold event. In FIG. 2, representative such "offset" thresholds are illustrated by the broken lines superimposed on the input (to detector 12) signal A, and denoted as upper and lower threshold voltages, respectively.

Referring again to FIG. 1, and as noted in greater detail hereinafter, at selected times during operation of detector 12 the comparators 18, 19 and 20 produce at their outputs signals denoted as B, C and D, respectively. The outputs (B and D) of comparators 18 and 20 are connected to the set and reset terminals, respectively, of a first flip flop FF1; and the output (C) of comparator 19 is connected to one input of an AND gate 32, the output of which is connected to the set terminal of a second flip flop FF2. Signal C is also applied through an inverter 34 to one input of a second AND gate 36 the output of which is applied to the reset terminal of FF2. The signal produced by the positive Q terminal of FF1, denoted as signal E, is applied to the other input of gate 32; and the signal F, which is produced by the negative Q terminal of FF1, is applied as the other input to gate 36. The output signal G from terminal Q of FF2 represents the substantially noise-free signal produced by detector 12.

In operation, and referring also to the signals as shown in FIG. 2, when comparator 18 receives input signal A plus 15 mv. at its inverting terminal, it is switched on when the voltage level of signal A falls below an approximately −15 mv. threshold, whereby a positive going binary signal B is produced at its output for the duration of time that signal A remains below −15 mv. When the voltage level of signal A again rises above the −15 mv. threshold, the output of comparator 18 goes low, and signal B is eclipsed or disappears. Similarly, when comparator 20 receives input signal A minus 15 mv. at its non-inverting terminal, it is switched on (goes high) when the voltage level of signal A rises above the approximately +15 mv. threshold, whereby the binary signal D is produced at its output for the duration of time that signal A remains above the +15 mv. When signal A falls below +15 mv, the output of comparator 20 goes low, and the signal D disappears or is eclipsed. Comparator 19 is designed to have absolute minimum offset, for example threshold values of plus or minus 2 mv. Therefore, signal A will cause comparator 19 to toggle high or low with each crossover event, thereby producing a binary signal C having high and low voltage levels coincident with signal A.

At this stage the converted signals B, C and D have been partially cleaned of noise which was present in the analog signal A. Noise occurring above or below the respective threshold values is eliminated by virtue of failing to produce any response by a given comparator. Yet to be removed is the noise which creates multiple transitions across the respective threshold levels. However, as noted hereinafter, provisions are made for removal thereof.

When signal B is transmitted to the set port or terminal of FF1, and assuming that FF1 is already in a reset mode, this flip-flop becomes set and emits the binary signal E from its Q port. When signal D is transmitted to the reset port of flip-flop FF1 (assuming it has been set) it becomes reset and emits signal F from its negative Q port. Noise is thus completely removed from binary signals B and D by flip-flop FF1, which responds only to the first threshold transition of each signal for the respective setting and resetting thereof. Signals E and F, therefore, are substantially free of noise.

Depending on the status of FF1, signal E will be transmitted to AND gate 32, or signal F will be transmitted to AND gate 36, which as noted above controls input into the R port of flip-flop FF2. The presence of AND gate 32 logically requires signal C and signal E both to be positive in order to set flip-flop FF2 for emission of the noise free output signal G from the Q port thereof. Likewise, AND gate 36 logically requires that its two inputs simultaneously receive a high or positive input signal F, and a low or no input signal C in order to reset flip-flop FF2. When FF2 is reset, however, emission of its output signal G ceases.

Due to the cooperation of signal C and signal E at AND gate 32, the enabling event which allows flip-flop FF2 to become set is a true zero crossover event of signal A in the positive direction. Likewise, due to the interaction of signal F and inverted signal C at AND Gate 36, the enabling event of signal A, which allows flip-flop FF2 to become reset, is also a true zero crossover event of signal A in the negative direction. Noise is therefore substantially completely removed from signal G by the action of AND gates 32 and 36 at flip-flop FF2, whereby only the first zero crossover event in the positive direction following a true high and true low event of signal A will result in setting flip-flop FF2 for emission of output signal G. Similarly, only the first zero crossover event in the negative direction following a true low and true high event of signal A will result in resetting flip-flop FF2 and cancelling the emission of output signal G. The result is that both the rise and fall of output signal G is substantially perfectly timed with the zero crossover events of signal A. This accurate timing event could not be achieved by known prior art.

By first eliminating the effects of multiple threshold transitions and secondly eliminating the effects of multiple zero crossover events, noise is effectively rejected from an analog input signal, and the end result is a clean binary output signal G having accurately timed transitions. Therefore, in application, a circuit of the type described will not only eliminate noise heretofore present in spark plug ignition systems, but also eliminate timing problems which occur when using conventional detectors.

While this invention has been described in connection with specific offset voltages to alter the threshold values for comparators 18 and 20, it is to be understood that values other than plus and minus 15 mv. may also be selected without departing from this invention, providing that they produce threshold signals which are strong and distinct enough to initiate substantially noise-free responses. Also, it should be noted that the offset voltage may be supplied by any conventional means, rather than by the batteries disclosed herein, without departing from the scope of this invention.

Moreover, although this invention has been illustrated and described in detail in connection with only certain embodiments thereof, it will be apparent that it is capable of still further modification, and that this application is intended to cover any such modifications as may fall within the scope of one skilled in the art, or the appended claims.

I claim:

1. A zero crossover detector for sensing an analog input signal and for producing a digital output signal at the exact moment that the analog input signal crosses through zero voltage, comprising
    first means for sensing an analog input signal and operative intermittently to generate a first binary output signal each time said input signal exceeds a predetermined voltage while going in one direction,
    second means for sensing said analog input signal and operative intermittently to generate a second binary output signal each time said input signal exceeds a predetermined voltage while going in the opposite direction,
    third means for sensing said analog input signal and operative for each cycle thereof to generate a third binary signal coincident with a zero voltage crossover of said input signal, and
    means connected to said sensing means and responsive to each generation of said third binary signal to produce a digital output signal coincident with said zero crossover of said input signal, provided that each of said first and second binary signals is generated in a cycle of said input signal preceding generation of said third binary signal.

2. A zero crossover detector as defined in claim 1, wherein both said first and second binary signals are generated in the cycle of said input signal immediately preceding generation of said third binary signal.

3. A zero crossover detector as defined in claim 1, wherein said sensing means are operative successively to generate said first, second and third binary signals.

4. A zero crossover detector as defined in claim 1, wherein each of said first and second sensing means includes means for adding a fixed voltage to said analog input signal to establish said predetermined voltages in said one and said opposite direction, respectively.

5. A zero crossover detector as defined in claim 4, wherein each of said fixed voltages has a value slightly less than the minimum value of the analog input signal which is to be sensed by the detector.

6. A zero crossover detector as defined in claim 1, wherein
    each of said sensing means includes a differential amplifier having two inputs and one output,
    each of two of such amplifiers has one of its inputs connected directly to said analog input signal, and has its other input connected through a supplemental voltage source to said input signal, whereby the respective output signals of said two amplifiers are not produced until predetermined minimum times after said input signal has crossed over zero in positive and negative going directions, respectively, and
    the third amplifier has each of its inputs connected directly to said analog input signal, whereby its output signal is produced each time said input signal crosses zero in a positive going direction.

7. A zero crossover detector as defined in claim 6, wherein
    one of said inputs of each of said amplifiers is a signal inverting input, and the other input of each of said amplifiers is a signal non-inverting input, and
    one of said other inputs of said two amplifiers is non-signal inverting and is connected through a positive supplemental voltage source to said input signal, and
    the other of said other inputs of said two amplifiers is signal inverting and is connected through a negative supplemental voltage source to said input signal.

8. A zero crossover detector as defined in claim 7, wherein
    said positive and negative supplemental voltage sources are of equal value, and
    the voltage of each of said sources is slightly less than the minimum value of the analog input signal which is to be sensed by the detector.

9. A zero crossover detector as defined in claim 1, wherein said means connected to said sensing means comprises,
    a first flip flop coupled to the outputs of said first and second sensing means, and having an output disposed to generate a fourth binary signal upon successive generation of said first and second binary signals in a cycle of said input voltage, and
    a second flip flop coupled to the outputs of said third sensing means and said first flip flop, and having an output operative, upon simultaneous generation of said third and said fourth binary signals, to produce said digital output signal.

10. A zero crossover detector as defined in claim 9, wherein
    the outputs of said first and second sensing means are connected to set and reset terminals, respectively, of said first flip flop, and
    said third and fourth binary signals are applied through an AND gate to a set terminal on said second flip flop.

11. A method of sensing an analog input signal and for producing a substantially noise free digital output signal at the exact moment that the analog input signal crosses through zero voltage, comprising
    sensing an analog input signal,
    generating a first binary signal after said input signal has exceeded a first predetermined minimum voltage in a positive going direction during each cycle thereof,
    generating a second binary signal after said input signal has exceeded a second predetermined minimum voltage in a negative going direction during each cycle thereof,
    generating a third binary signal at the end of each cycle of said input voltage at the moment that the input voltage passes through zero in a positive going direction, momentarily generating a fourth binary signal upon successive generation of said first and second binary signals in a given cycle of said input signal, and generating a digital output signal concurrently with said third binary signal each time said third binary signal is generated in the presence of said fourth binary signal.

12. A method as defined in claim 11, wherein generating said first binary signal includes adding to said input signal a positive voltage to establish said first predetermined minimum voltage, and generating said second binary signal includes adding to said input signal a negative voltage to establish said second predetermined minimum voltage.

13. A method as defined in claim 12, wherein said positive and negative voltages are equal and are slightly less than the minimum value of the analog input voltage that is to be sensed.

* * * * *